United States Patent [19]

Wilson et al.

[11] Patent Number: 5,381,144

[45] Date of Patent: Jan. 10, 1995

[54] VERSATILE ESCAPE RUN-LEVEL CODER FOR DIGITAL VIDEO SIGNAL PROCESSING APPARATUS

[75] Inventors: William B. Wilson; Sau-Tsien Lim, both of Singapore, Singapore

[73] Assignee: Matsushita Electric Industrial Co., Ltd., Osaka, Japan

[21] Appl. No.: 140,416

[22] Filed: Oct. 25, 1993

[30] Foreign Application Priority Data

Oct. 28, 1992 [JP] Japan .................................. 4-290479

[51] Int. Cl.$^6$ ............................................. H03M 7/46
[52] U.S. Cl. ........................................ 341/63; 341/67
[58] Field of Search ............................ 341/50, 63, 67

[56] References Cited

U.S. PATENT DOCUMENTS

| | | | |
|---|---|---|---|
| 4,494,151 | 1/1985 | Liao | 358/261 |
| 4,610,027 | 9/1986 | Anderson et al. | 382/56 |
| 4,811,113 | 3/1989 | Ozeki et al. | 358/261.1 |
| 5,140,322 | 8/1992 | Sakagami | 341/65 |
| 5,289,190 | 2/1994 | Shimoda et al. | 341/150 |

OTHER PUBLICATIONS

"Recommendation H.261-Video Codec for Audiovisual Services at px64 kbit/s", the International Telegraph and Telephone Consultative Committee, Study Group XV-Report R 37, pp. 79-107, Aug. 1990.

CD 11172-1 "Coding of Moving Pictures and Associated Audio for Digital Storage Media at up to about 1.5Mbps", the International Organization for Standardization, ISO MPEG Document, ISO-IEX/JTC1/SC2/WG8, 1992.

"Matsushita Algorithm for Coding of Moving Picture Information" (Proposal Description for MPEG-II), by International Organization for Standardization, ISO/IEC-JTC1/SC29/WG11, MPEG91/217, Nov. 13, 1991.

*Primary Examiner*—Marc S. Hoff
*Attorney, Agent, or Firm*—Sandler, Greenblum & Bernstein

[57] ABSTRACT

A versatile escape run-level coder for use in a digital video signal processing apparatus which produces a run-level data and an escape prefix code carrying escape code and escape code length data. A selection logic detects the level of the level data in the run-level data. When the level is detected as in a mid range, three selectors select short length data, data from the code extender 13 which inserts meaningless 8-bit code, and data from code concatenator 1, respectively. The selected data are concatenated in a second code concatenator for forming a tailor made code which is 36-bit long, but the effective data length is, for example, 20 bits. When the level is detected as in a range above or below the mid range, the three selectors select long length data, data from the line carrying ESC code and data from either one of the two level coders, respectively. The selected data are concatenated in the second code concatenator for forming a tailor made code which is 36-bit long, but the effective data length is, for example, 28 bits.

7 Claims, 6 Drawing Sheets

| LINE L1 | | LINE L2 |
|---|---|---|
| RUN | LEVEL | VLC |
| 0 | 10 | 101000 |
| 0 | 5 | 101010 |
| 0 | 6 | 101001 |
| 1 | 1 | 101011 |
| 0 | 1 | 100 |
|   | eob | 11 |

| FIXED LENGTH CODE | RUN |
|---|---|
| 0000 00 | 0 |
| 0000 01 | 1 |
| 0000 10 | 2 |
| ... | ... |
| ... | ... |
| 1111 10 | 62 |
| 1111 11 | 63 |

Fig.2b

| SHORT/LONG LEVEL CODE | LEVEL DATA DECIMAL | LEVEL DATA BINARY | |
|---|---|---|---|
| FORBIDDEN | -256 | 1 0000 0000 | 1ST OUTER RANGE |
| 1000 0000 0000 0001 | -255 | 1 0000 0001 | |
| R1→ 1000 0000 0000 0010 | -254 | 1 0000 0010 | |
| ... | ... | ... | |
| 1000 0000 0111 1111 | -129 | 1 0111 1111 | |
| 1000 0000 1000 0000 | -128 | 1 1000 0000 | |
| 1000 0001 | -127 | 1 0000 0001 | MID RANGE |
| 1000 0010 | -126 | 1 0000 0010 | |
| ... | ... | ... | |
| R2→ 1111 1110 | -2 | 1 1111 1110 | |
| 1111 1111 | -1 | 1 1111 1111 | |
| FORBIDDEN | 0 | 0 0000 0000 | |
| 0000 0001 | 1 | 0 0000 0001 | |
| ... | ... | ... | |
| 0111 1111 | 127 | 0 0111 1111 | |
| 0000 0000 1000 0000 | 128 | 0 1000 0000 | 2ND OUTER RANGE |
| R3→ 0000 0000 1000 0001 | 129 | 0 1000 0001 | |
| ... | ... | ... | |
| 0000 0000 1111 1111 | 255 | 0 1111 1111 | |

VERSATILE ESCAPE RUN-LEVEL CODER FOR DIGITAL VIDEO SIGNAL PROCESSING APPARATUS

BACKGROUND OF THE INVENTION
1. Field of the Invention

The present invention relates to an escape run-level coder for use in a digital video signal processing apparatus that compresses and transmits bit streams conforming to, for example, syntax like that of H.261 (see "Recommendation H.261—Video Coder for Audiovisual Services at px64 kbit/s" by International Telegraph and Telephone Consultative Committee, Study Group XV, CCITT Subgroup XV Document, Report R 37, August 1990) and MPEG-1 (see "CD 11172—Coding of Moving Pictures and Associated Audio for Digital Storage Media at up to about 1.5 Mbps" by International Organization for Standardization, ISO MPEG Document, ISO-IEC/JTC1/SC2/WG8, 1992).
2. Description of the Prior Art In a prior art digital video signal processing apparatus, a lossy coding algorithm based on the discrete cosine transform (DCT) precedes a lossless encoder based on variable length coding (VLC). The transform coefficients are run-level and entropy coded, in which the most common run-level combinations are given the shortest codes and the less common combinations longer codes. The least commonly occurring codes are not given special codes, but are coded as fixed length data. For example, in H.261 infrequent combinations are coded as a 6 bit escape sequence, 6 bits representing the run length, and 8 bits representing the level. The total is a 20 bit fixed length code. MPEG-1 is similar with the exception that the level is represented in either 8 or 16 bits. In both H.261 and MPEG-1 the escape prefix is a fixed length bit sequence which does not very. No prior art exists for an escape coder which has a programmable escape prefix capability.

A versatile code must support existing standards (such as H.261 and MPEG-1) as well as any expected new standards or perceived extensions to the existing standards, such as the Matsushita Proposal for MPEG-2 (see "Matsushita Proposal Description for MPEG-II", by International Organization for Standardization, ISO/IEC-JTC1/SC29/WGII, MPEG91/217, 1991). The following problems need to be solved by the versatile escape run-level coder:

1. In a versatile escape run-level coder, the escape prefix bit sequence must be programmable. For example, the Matsushita Proposal for MPEG-2 supports three different prefix bit sequences all of different lengths. An object of this invention is to support a programmable escape prefix bit sequence.
2. The escape run-level coder must be able to handle high rate of data throughput. For example, for 4:1:1 sampled wide television, the pixel rate is about 27 MHz. The escape run-level coder must be able to code (but not be limited to) run-level combinations at this rate. An object of this invention is to encode escape codes with minimum delay.
3. The implementation must be cost effective. Concatenating several bit sequences of variable length together typically requires the use of a shifter, but shifters capable of the high rate data throughput are costly. An object of this invention is to encode escape codes without using a fast shifter because it is expensive.

SUMMARY OF THE INVENTION

The present invention has been developed with a view to substantially solving the above described disadvantages and has for its essential object to provide an improved escape run-level coder for use in a digital video signal processing apparatus.

According to the present invention, a versatile escape run-level coder is provided for use in a digital video signal processing apparatus which produces a run-level data and an escape prefix code. In the coder, means are provided for detecting a level of the run-level data, detecting whether the detected level is in a first range (mid range) or not, and for producing a first range signal (mid range signal) when the detected level is in the first range, and an outer range signal when the detected level is outside the first range. First sending means are provided for sending, in response to the first range signal, the run-level data without inserting any meaningful data; and second sending means are provided for sending, in response to the outer range signal, the run-level data with an insertion of a predetermined meaningful data. Means are provided for calculating, in response to the first range signal and the outer range signal, a length of the run-level data together with the escape prefix code, in which the calculated length calculated in response to the first range signal is greater than that calculated in response to the outer range signal, and for producing an effective length data. Means are provided for concatenating the run-level data, the escape prefix code and the effective length data.

The invention further uses, for example, a latch to allow the escape prefix code to be programmable. By identifying the characteristics of the coding algorithms in coding the level as 8 or 16 bits, minimal logic is needed for concatenating the prefix, the run-level. This results in more cost effective design and still maintains high throughput due to the short signal propagation delay through the circuit. When implementing the concatenation using a selectors of the prefix, the run-level code that locks an expensive shifter also increases the cost effectiveness. The means for calculating the resulting length of the said escape code includes an adder.

The programmable latch allows different variable bit sequence escape prefix codes to be used. Each prefix bit sequence of different length, is loaded into the latch with the length of the bit sequence. The coder uses this length and the coded length of the run-level bit sequence to calculate the total length of the escape code bit sequence by using an adder. The level bit sequence is coded as either 8 or 16 bits. Selectors are then used to choose the correct bit sequences for concatenating the escape code bit sequence. A selection logic is used to determine when the coded level is 8 or 16 bits, based on the input data.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1A:
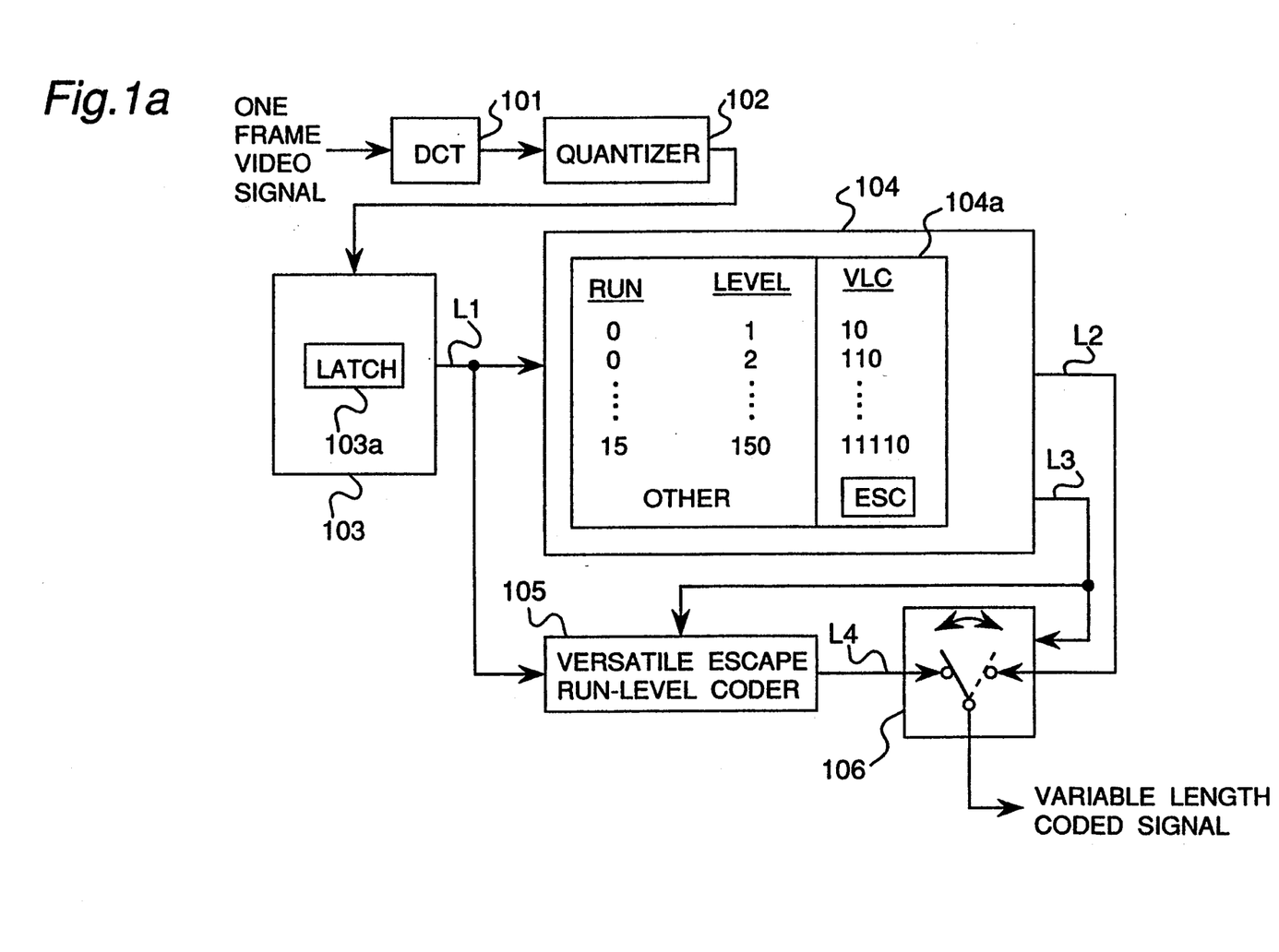
FIG. 1a is a block diagram of a digital video signal processing apparatus in which a versatile escape run-level coder according to the present invention is employed.

Referring to FIG. 1a, a block diagram of a digital video signal processing apparatus is shown. The digital video signal processing apparatus comprises an input for receiving a digital video signal of one frame, a discrete cosine transformation (DCT) operator 101 for performing the discrete cosine transformation operation, a quantizer 102, a run-level detector 103 having a latch 103a, a variable length coder 104 having a look-up table 104a, a versatile escape run-length coder 105 and a switch 106.

One frame video signal data is divided into a plurality of blocks, and then each block is processed in DCT operator 101 and quantizer 102, and the processed result is temporarily stored in latch 103a in the run-level detector 103. The run-level detector 103 detects run data and level data, as will be explained later, and the detected run-level data is transmitted through line L1 to variable length coder 104 and also to versatile escape run-length coder 105.

More specifically, each time the DCT operator 101 receives one block of data, a DCT operation is carried out to obtain frequency components analyzed in horizontal and vertical directions. The DCT converted result is quantized in quantizer 102 and plotted on an 8×8 graph in latch 103a, as shown in FIG. 1b, such that each box in 8×8 graph will carry amount of frequency component analyzed by the DCT operation.

Figure 1B:
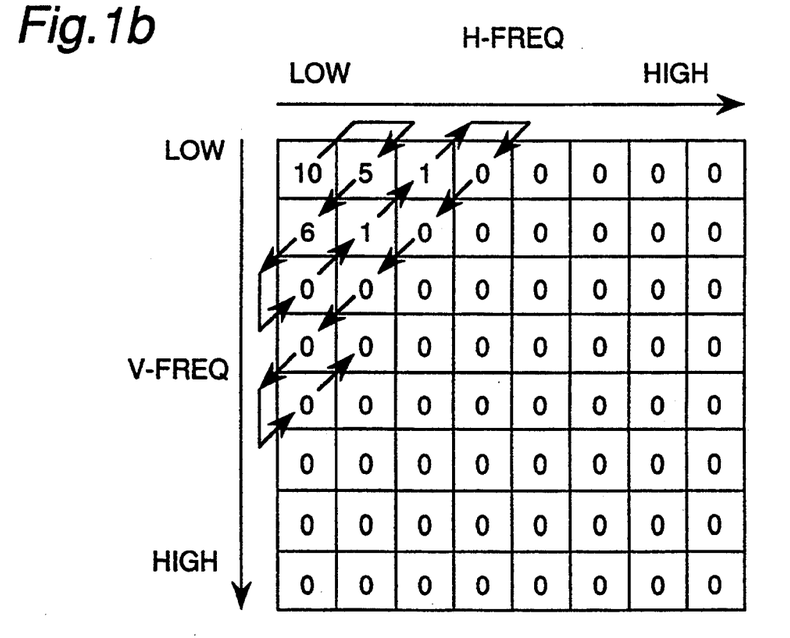
FIG. 1b is a diagram showing the result of the DCT operation.

In FIG. 1b, the DC component will be stored in the left column, top box 400, and the AC components will be stored in other boxes, such that higher the frequency, the further away from box 400 the storing box will be.

For example, if the image in the processing block in the DCT operator 101 is a portion of a black sheet having no mark but plain black, DCT converted data will have only a DC component. Thus, the DCT converted data will be given only in box 400, and all the remaining boxes will carry "0s".

If the image in the processing block is, for example, a portion of vertical narrow black and white stripes, DCT converted data will have low frequency components in the vertical analyzed direction, but low and high frequency components in the horizontal analyzed direction. Thus, the DCT converted data will be plotted in the boxes of the upper first to several rows in the 8×8 graph, and the remaining boxes will carry "0s".

Similarly, if the image in the processing block is a portion of horizontal narrow stripes, DCT converted data will have low frequency components in the horizontal analyzed direction, but low and high frequency components in the vertical analyzed direction. Thus, the DCT converted data will be plotted in the boxes of the first to several columns from the left side in the 8×8 graph, and the remaining boxes will carry "0s".

Furthermore, if the image in the processing block is a portion of a checkerboard pattern with tiny squares, DCT converted data will have low and high frequency components in both vertical and horizontal directions. Thus, the DCT converted data will be plotted in almost all the boxes in the 8×8 graph.

The run-level detector 103 reads the data in the 8×8 graph from latch 103a such that the reading starts from the DC component in box 400 and proceeds in a zigzag pattern from the low frequency component to high frequency component, as shown by an arrow in FIG. 1b.

Figure 1C:
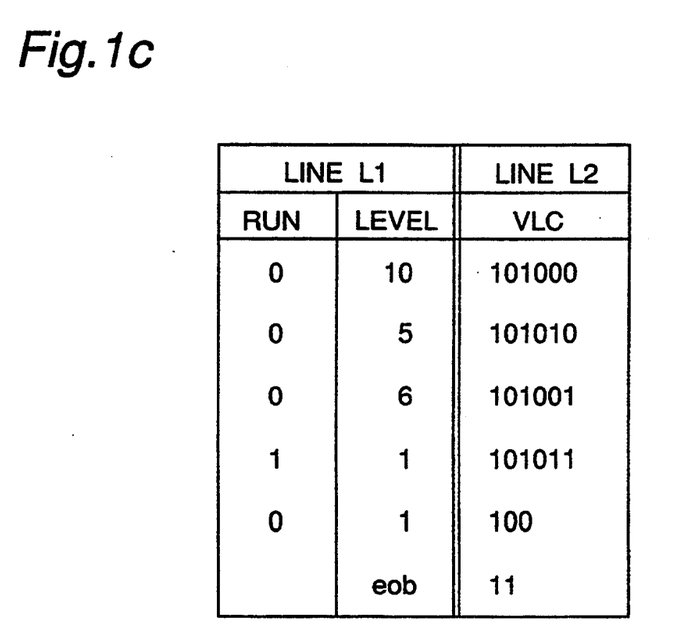
FIG. 1c is a table showing the data transmitted along lines L1 and L2.

The data stored in latch 103a is examined by the run-level detector 103. According to the example shown in FIG. 1b, the zig-zag reading of the data stored in latch 103a is (10, 5, 6, 0, 1, 1, 0, 0, 0, ..., 0). In this case, the run data and the level data will be as shown in FIG. 1c. More specifically, the first level is "10" and its run is "0", and there are no "0"s preceding the first data "10". The second level is "5" and its run is "0". The third level is "6" and its run is "0". The fourth level is "1" and its run is "1", because the fourth level "1" is preceded by one "0". The fifth level is "1" and its run is "0". As apparent from the above, the level data indicates the specific data, and the run data indicates the number of "0"s which precede the specific data. The final 57 "0"s do not have a run-level value because there is no non-zero value to represent the level. An "end of block" (eob) code can be assigned to represent these final "0" values.

Figure 1D:
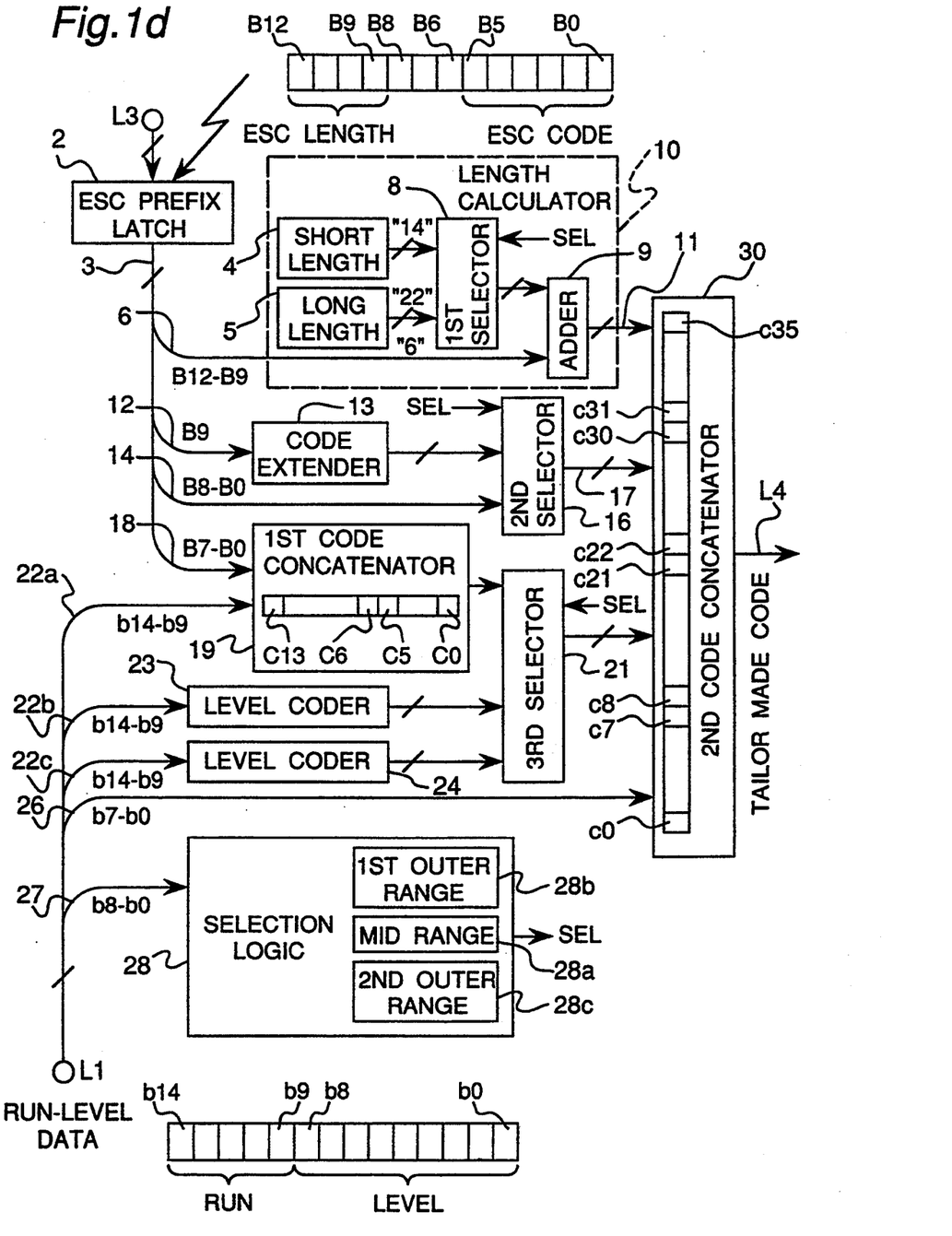
FIG. 1d is a block diagram of the versatile escape run-level coder according to a preferred embodiment of the present invention.
Figure 2A:
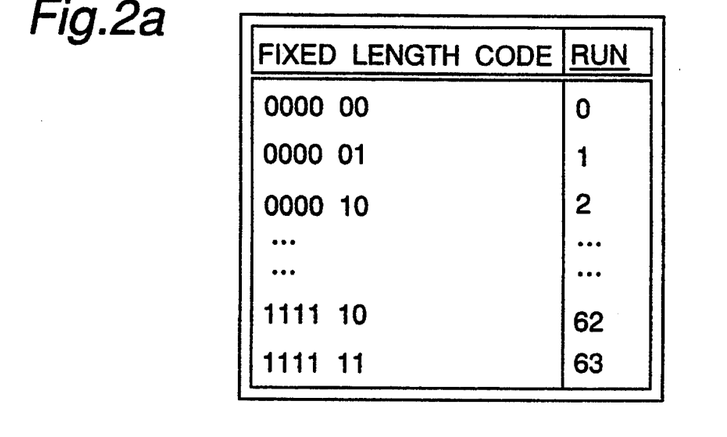
FIG. 2a is a table showing the 6 bit fixed length code of the run data.

The run-level detector 103 produces along line L1, run-level data which is a combination of the run data and the level data. According to the present embodiment, as shown at the bottom of FIG. 1d, the run data is six bits long (b14–b9), and the level data is nine bits long (b8–b0) with the most significant bit (b8) thereof being used for the sign such that "0" represents plus and "1" represents minus. The level data is represented as a signed twos complement number. The run-level data is applied to the variable length coder 104 and also to the versatile escape run-level coder 105. The run data are also shown in the right column of the Table in FIG. 2a, and the level data are also shown in the right column of the Table in FIG. 2b.

In the variable length coder 104, the run-level data is changed to a variable length code (VLC) using the look-up table 104a. The contents of the look-up table 104a in this diagram are illustrative only. The contents are not specified in this specification. The look-up table 104a is previously stored with bit sequences representing various combinations of run data and level data. If the 8×8 graph is used, the run data may take values between 0 and 63. Also, when the level data, ignoring the sign, takes a number between 0 and 256, the number of possible combinations will be 64×256 (=16,384), resulting in an enormous size look-up table 104a if every possible combination of run and level data is assigned with a variable length code. According to the present invention, however, the look-up table 104a lists not every possible combination, but relatively few (e.g., 120) which occur most frequently, and assigns a specific variable length code to each of the listed combinations.

As to the non-listed combination which occur less frequently, an escape code ESC is assigned.

The variable length coder 104 receives run-level data from the run-level detector 103 and has a search function to search for the run-level data's corresponding variable length bit sequence in the look-up table 104a. The variable length coder 104 reads the corresponding variable length code and sends it out through line L2. However, when the run-level data's corresponding variable length code is not found in the look-up table 104a, the variable length coder 104 reads the escape code ESC and sends the escape code ESC together with an ESC code length data through line L3. The ESC code and the ESC code length data taken together is referred to as an escape prefix code. The ESC code length may be changed with respect to the size of the look-up table. For example, when a small size look-up table is used, the ESC code may have a short length, and when a large size look-up table is used, the ESC code may have a long length. According to the present embodiment, it is assumed that the bit length of the ESC code is "six".

As apparent from the above, the variable length coder 104 produces either the variable length code through line L2 or the escape prefix code through line L3. When the escape prefix code is not produced along line L3, the switch 106 is turned to a position shown by the dotted line. Thus, the variable length code produced along line L2 is outputted from switch 106. On the other hand, when the escape prefix code is produced along line L3, switch 106 is turned to a position shown by the solid line and the versatile escape run-level coder 105 is activated to produce a tailor made code along line L4 in a manner which will be described later. Thus, in the latter case, instead of the variable length code, the tailor made code is outputted from switch 106.

Figure 2B:
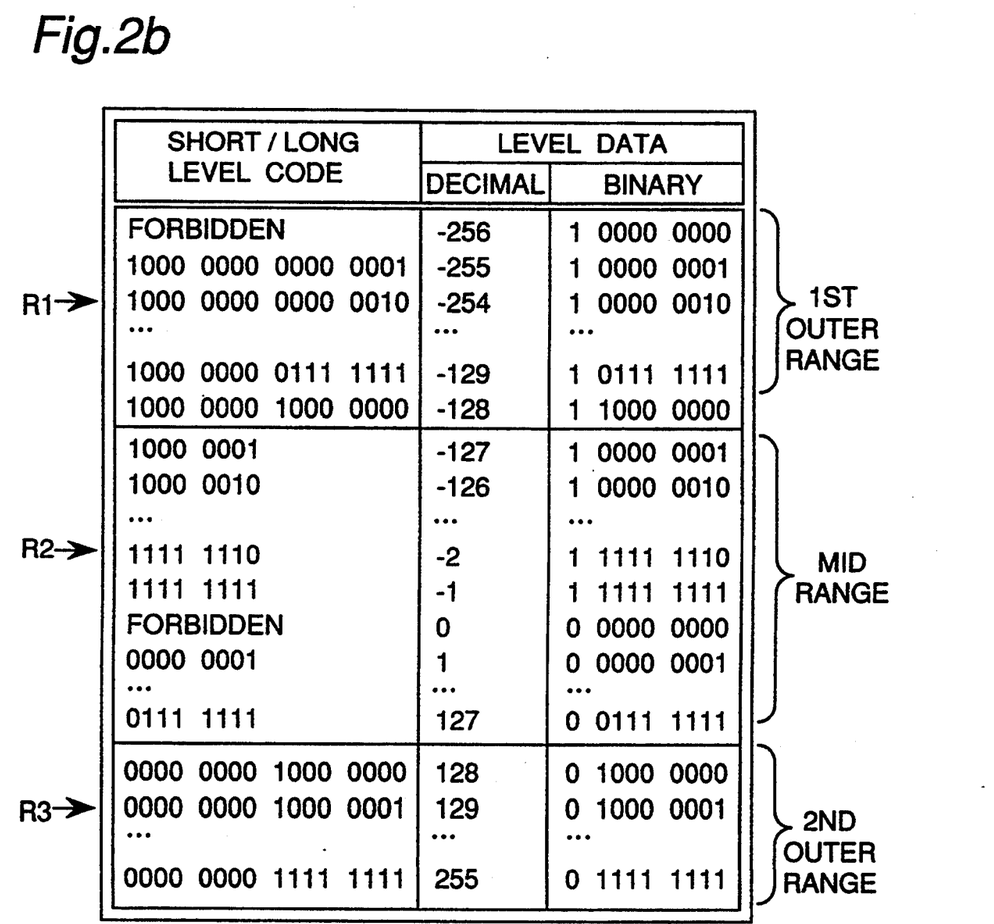
FIG. 2b is a table showing the short and long level codes.
Figure 3A:
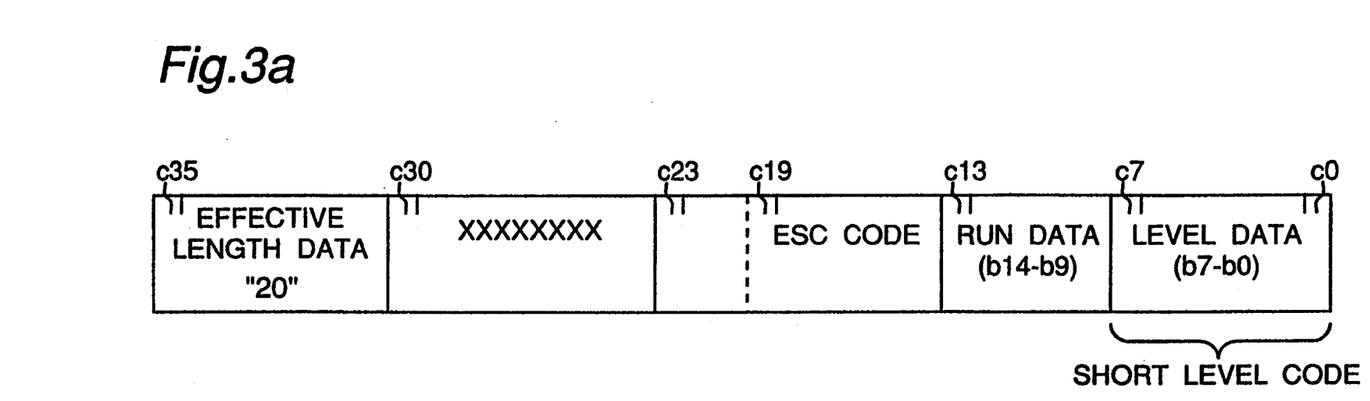
FIG. 3a is the output format of the coded bit sequence with a short level code.
Figure 3B:
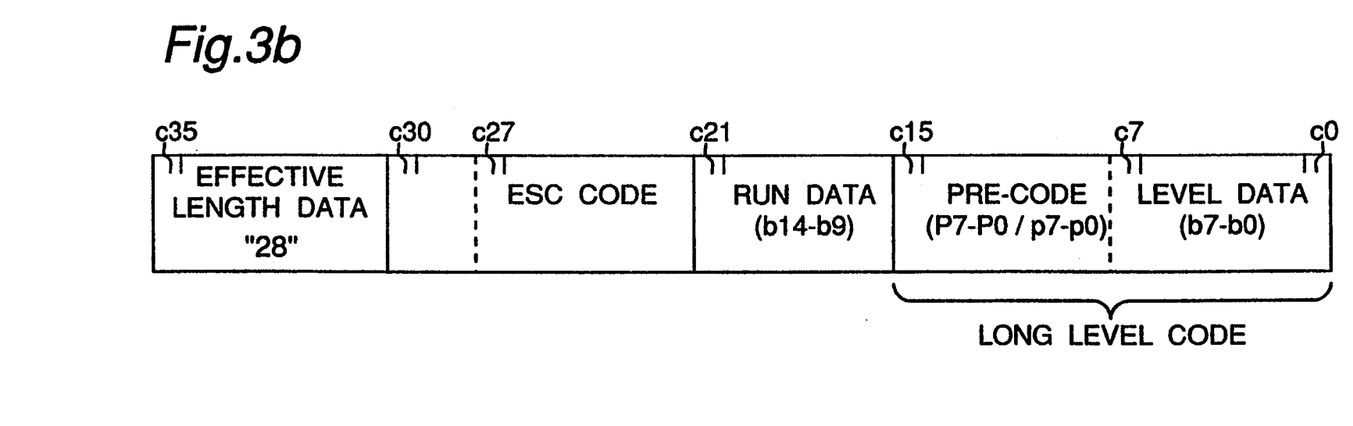
FIG. 3b is the output format of the coded bit sequence with a long level code.

Referring to FIG. 1d, a detail of the versatile escape run-level coder 105 is shown. The coding algorithm and format of the bit sequence for the embodiment are illustrated in the coding table in FIGS. 2a and 2b, and output formats of the tailor made code are illustrated in FIGS. 3a and 3b. The example allows any variable bit sequence escape prefix code of less than or equal to 9 bits to be used. This is a limitation of the embodiment and not of the invention. The coding algorithm presented is compatible with but not limited to that of MPEG-1, H.261 and the MEI (Matsushita Electric Industrial) proposed for MPEG-2 syntax.

In FIG. 1d, reference numeral 2 is an escape prefix latch which receives the escape prefix code from line L3. The escape prefix latch 2 has, according to the example shown in FIG. 1d, a capacity of 13 bits (B12–B0) in which the four most significant bits (B12–B9) are used for storing the ESC code length data and the six least significant bits (B5–B0) are used for storing the escape code ESC. According to the present embodiment, the escape code ESC has a length of six bits, but can be shorter or longer but should be equal to or less than 9 bits, in the example shown in FIG. 1d. In the case where the longer escape code ESC is used, all or some of the remaining four bits (B8–B6) are also used for storing such a long escape code ESC. Thus, it is possible to have the programmable escape prefix capability.

A reference numeral 3 is a parallel line produced from the latch 2 and carries the escape prefix code bit sequence data (B12–B0); 6 is a parallel line for carrying the ESC code length data (B12–B9); 12 is a parallel line for carrying at least one upper bit (B8) of the escape code ESC; 14 is a parallel line for carrying the escape code ESC (B8–B0); and 18 is a parallel line for carrying the least significant eight bits (B7–B0).

The parallel line 6 is applied to a length calculator 10 which includes: a short length data generator 4 for generating numeric data indicative of "14"; a long length data generator 5 for generating a numeric data indicative of "22"; a first selector 8 for selecting either the numeric data from generator 4 or the numeric data from generator 5 in response to a selection control signal SEL produced from a selection logic 28 as will be described later; an adder 9 for adding the number carried in bits B12–B9 (in the present embodiment, "six") and the number carried in the selected numeric data. The adder 9 produces a five-bit long effective length data ward, which is equal to the sum of the addition carried in the adder 9, along a line 11. According to the present embodiment, the number carried in bits B12–B9 is "six". Thus, the effective length of data on line 11 is either "20" or "28". Since the number "six" carried on bits B12–B9 and representing the bit length of the escape code is provided separately, this number can be easily varied according to the user's desire, thus presenting the programmable escape prefix capability.

The short length data "14" generated by the short length data generator 4 is obtained by adding the run data bit length (six bits) and the bit length (eight bits) of a short level code. Similarly, the long length data "22" generated by the long length data generator 5 is obtained by adding the run data bit length (six bits) and the bit length (16 bits) of a long level code. The short level code is established when only the eight bit level data is added after the run data, as diagrammatically shown in FIG. 3a, and the long level code is established when an eight bit pre-code, which will be explained later, and the eight bit level data are added after the run data, as shown in FIG. 3b.

The parallel line 12 is applied to a code extender 13 which adds eight bits of meaningless data but to occupy predetermined bits, i.e., any arbitrary data before the bit data (B8) from the line 12. According to the present embodiment, the arbitrary data is eight bits long and comprises all zeros (0000 0000). Thus, the data produced from the code extender 13 is a nine bits long (0000 0000 B8) which is applied to a second selector 16.

The parallel line 14 carrying data (B8–B0) is applied to the second selector 16, which selects, in response to the selection control signal SEL, either the data (0000 0000 B8) from the code extender 13 or the data (B8–B0) from line 14.

The parallel line 18 carrying the eight bit data (B7–B0) is applied to a first code concatenator 19. The output of the first code concatenator 19 is 14 bits wide (C13–CO). The 8 bits from line 18 (B7–B0) occupy the 8 most significant bits (C13–C6) output from the first code concatenator 19.

Furthermore, in FIG. 1d, reference numeral L1 is a 15-bit parallel line carrying the run-level data (b14–b0) from run-level detector 103; 27 is a parallel line carrying the run-level data (b8–b0); 26 is a parallel line carrying the level data (b7–b0); and 22a, 22b and 22c are each parallel lines carrying the run data (b14–b9).

The parallel line 27 is applied to the selection logic 28 which has a mid range detector 28a, a first outer range detector 28b, and a second outer range detector 28c, and detects one of the three ranges in which the received level data (b8–b0) is located. When the level data (b8-b0) is in the mid range, e.g., between −127 and +127, the selection logic 28 produces a mid range signal, as shown in FIG. 2b; when the level data (b8-b0) is in the first outer range, e.g., equal to or smaller than −128, the selection logic 28 produces a first outer range signal; and when the level data (b8-b0) is in the second outer range, e.g., equal to or greater than +128, the selection logic 28 produces a second outer range signal. The mid range signal, the first outer range signal and the second outer range signal are generally referred to as the selection control signal SEL.

The parallel line 26 is applied to a second code concatenator 30, the output of which is 36 bits wide (c35-c0). The eight least significant bits (c0-c7) of the latch 30a are coupled with the parallel line 26. Thus, the level data (b7-b0) is stored as it is in the eight least significant bits (c7-c0).

The parallel line 22a is applied to the first code concatenator 19, particularly to the lower six bits (C5-C0) of the output. Thus, for the output of the first code concatenator, the lower six bits (C5-C0) are filled with the six bit run data (b14-b9) from line 22a, and the upper eight bits (C13-C6) are filled with the lower eight bits (B7-B0) of the escape prefix code, as described above. Thus, the first code concatenator 19 produces a 14 bit long data block (B7 B6 B5 B4 B3 B2 B1 B0 b14 b13 b12 b11 b10 b9).

Figure 4A:
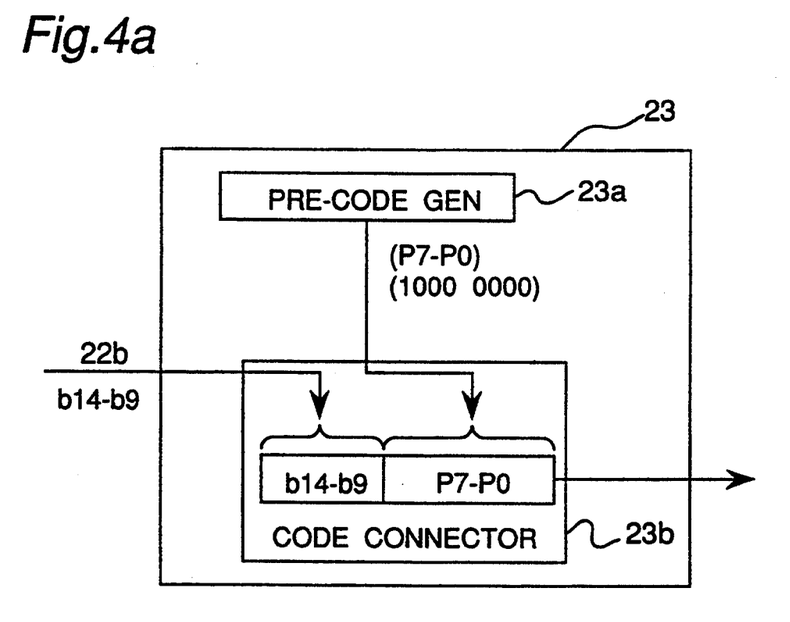
FIGS. 4a and 4b are block diagrams of level coders.

The parallel line 22b is applied to a first level coder 23 which has, as shown in FIG. 4a, a pre-code generator 23a for generating a first pre-code (P7-P0) and a code connector 23b for connecting the run data (b14-b9) from the line 22b and the first pre-code (P7-P0). The run data (b14-b9) takes the upper bit positions and the first pre-code (P7-P0) takes the lower bit positions. According to the present embodiment, the first pre-code (P7-P0) is meaningful data defined by an eight bit long data block (1000 0000), serving as a part of a level code. Thus, the first level coder 23 produces a 14 bit long level code data block (b14 b13 b12 b11 b10 b9 1000 0000).

Figure 4B:
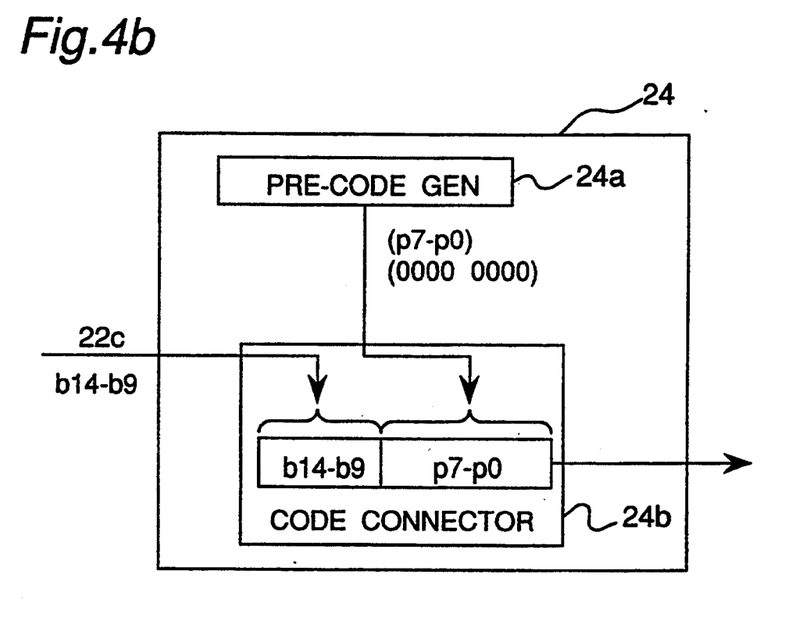

The parallel line 22c is applied to a second level coder 24 which has, as shown in FIG. 4b, a structure similar to that of the first level coder 23. Specifically, the second level coder 24 has a pre-code generator 24a for generating a second pre-code (p7-p0) and a code connector 24b for connecting the run data (b14-b9) from the line 22c to the second precode (p7-p0). The run data (b14-b9) takes the upper bit positions and the first pre-code (p7-p0) takes the lower bit positions. According to the present embodiment, the second pre-code (p7-p0) is a meaningful data block defined by an eight bit long data block (0000 0000). Thus, the second level coder 24 produces a 14 bit long level code data block (b14 b13 b12 b11 b10 b9 0000 0000).

The three respective outputs respectively from the first code concatenator 19, the first level coder 23 and the second level coder 24 are applied to a third selector 21 which selects, upon receipt of the selection control signal SEL, one of the three outputs and applies the selected output to the mid bits (c21-c8) of the output of the second code concatenator 30.

In the case where the third selector 21 selects an output from the first code concatenator 19, the six bit run data (b14-b9) will be located at bit positions c13-c8 of the output of the second code concatenator 30 as best shown in FIG. 3a. In this case, the level data (b7-b0) following the run data defines a short level code which has a bit length of eight bits.

On the other hand, in the case where the third selector 21 selects an output from either level coder 23 or 24, the six bit run data block (b14-b9) will be located at bit positions c21-c16 in the output of the second code concatenator 30 as best shown in FIG. 3b, with an insertion of the eight bit pre-code before the run data. In this case, the pre-code and the level data (b7-b0) taken together defines a long level code which has a bit length of 16 bits.

The first, second and third selectors 8, 16 and 21 are so arranged as to select one of plural inputs in response to a different selection control signal SEL, as given in the Table 1 below.

TABLE 1

| SEL | Selector 8 | Selector 16 | Selector 21 |
|---|---|---|---|
| 1st Outer Range | Long Length 5 | Line 14 | Level Coder 23 |
| Mid Range | Short Length 4 | Code Extender 13 | Code Concatenator 19 |
| 2nd Outer Range | Long Length 5 | Line 14 | Level Coder 24 |

As apparent from Table 1, when the selection control signal SEL indicates that the level data is in the first outer range, selectors 8, 16 and 21 select outputs from the long length data generator 5, line 14 and level coder 23, respectively. When the selection control signal SEL indicates that the level data is in the mid range, selectors 8, 16 and 21 select outputs from the short length data generator 4, code extender 13 and code concatenator 19, respectively. When the selection control signal SEL indicates that the level data is in the second outer range, selectors 8, 16 and 21 select outputs from the long length data generator 5, line 14, and level coder 24, respectively. The selected signal is outputted from the selector.

In operation, it is assumed that a run-level data block is applied to line L1 and, at the same time, an escape prefix code is applied to line L3. Below, three different cases are explained: the first case is when a run-level data R1 (see FIG. 2b) with a level data value that falls in the first outer range, is observed at line L1; the second case is when run-level data R2 with a level data value that falls in the mid range is observed at line L1; and the third case is when run-level data R3 with a level data value that falls in the second outer range is observed at line L1.

According to the first case, i.e., when run-level data R1 (see FIG. 2b) with a level data value that falls in the first outer range, is observed at line L1, selectors 8, 16 and 21 select outputs from the long length data generator 5, line 14 and level coder 23, respectively. Accordingly, the second code concatenator 30 outputs the data as shown in FIG. 3b. More specifically, at bit positions c7-c0, the level data transmitted along line 26 is installed. At bit positions c21-c8, the run data in bits b14-b9 and the first pre-code P7-P0 (1000 0000 in this embodiment) from the first level coder 23 are installed. At bit positions c30-c22, escape code B5-B0 together with the vacant data B8-B6 along line 14 is installed. Finally, at bit positions c35-c31, the data indicative of the effective length is installed. In this case, since the first selector 8 has selected the long length data, "22", from long length data generator 5, the sum produced from adder 9 is "28" (=22+6). Thus, the effective length of the data is 28. In this manner, the 36 bit long tailor made code as produced by the second code concatenator 30 is outputted along line L4. In the next stage (not shown) the effective data length is read, and the data of the effective length (in this case 28 bits) is extracted from the tailor made code to define the variable length coded signal.

According to the second case, i.e., when a run-level data R2 with a level data value that falls in the mid range is observed at line L1, selectors 8, 16 and 21 select outputs from the short length data generator 4, code extender 13 and first code concatenator 19, respectively. Accordingly, the second code concatenator 30 outputs the data as shown in FIG. 3a. More specifically, at bit positions c7-c0, the level data transmitted along line 26 is installed. At bit positions c21-c8, the run data in bits b14-b9 and the bits B7-B0 from along line 18 from the escape prefix latch 2 are installed. At bit positions c30-c22, data from the code extender 13 is installed. Thus, bits B7-B0 installed at bit positions c21-c14 are properly concatenated with bits B8 from the code extender 13. Finally, at bit positions c35-c31, the data indicative of the effective length is installed. In this case, since the first selector 8 has selected the short length data, "14", from short length data generator 4, the sum produced from adder 9 is "20" (=14+6). Thus, the effective length of the data is 20, which will be used in the next stage for the proper data extraction. According to the third case, i.e., when a run-level data R3 with a level data value that falls in the second outer range, is observed at line L1, selectors 8, 16 and 21 select outputs from the long length data generator 5, line 14 and level coder 24, respectively. Accordingly, the second code concatenator 30 outputs the data as shown in FIG. 3b. The difference with respect to the first case is that the pre-code p7-p0 is selected instead of the pre-code P7-P0. More specifically, at bit positions c7-c0, the level data transmitted along line 26 is installed. At bit positions c21-c8, the run data in bits b14-b9 and the second pre-code p7-p0 (0000 0000 in this embodiment) from the second level coder 24 are installed. At bit positions c30-c22, an escape code B5-B0 is installed together with the vacant data B8-B6 along line. Finally, at bit positions c35-c31, the data indicative of the effective length is installed. In this case, since the first selector 8 has selected the long length data, "22", from long length data generator 5, the sum produced from adder 9 is "28" (=22+6). Thus, the effective length of the data is 28, which will be used in the next stage for the proper data extraction.

According to the present invention, the run-level data and the escape code can be concatenated with minimal delay and with a simple arrangement.

The present invention supports coding algorithms that use a fixed length prefix bit sequence, such as H.261 and MPEG-1 standard, and also a variable length prefix such as the Matsushita Proposal for MPEG-2 that supports three different prefix bit sequences all of different length. This architecture requires less logic than a design that uses a fast shifter for concatenating several bit sequences of variable length.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A versatile escape run-level coder for use in a digital video signal processing apparatus which produces run-level data and an escape prefix code, said versatile escape run-level coder comprising:
    means for detecting a level of said run-level data, for detecting whether said detected level is in a first range, and for producing a first range signal when said detected level is in said first range, and an outer range signal when said detected level is outside said first range;
    first sending means for sending, in response to said first range signal, said run-level data without any meaningful data;
    second sending means for sending, in response to said outer range signal, said run-level data with an insertion of predetermined meaningful data;
    means for calculating, in response to said first range signal and in response to said outer range signal, a length of said run-level data together with said escape prefix code, in which the calculated length calculated in response to said first range signal is greater than the calculated length calculated in response to said outer range signal, and for producing effective length data; and
    means for concatenating said run-level data, said escape prefix code and said effective length data.

2. A versatile escape run-level coder as claimed in claim 1, wherein said escape prefix code carries an escape code and bit length data indicative of the bit length of the escape code, and wherein said calculating means comprises an adder for adding the length of said run-level data and the length of said escape code.

3. A versatile escape run-level coder as claimed in claim 1, further comprising:
    third sending means for sending, in response to said first range signal, said escape prefix code with an insertion of meaningless data having a predetermined length for occupying predetermined bits; and
    fourth sending means for sending, in response to said outer range signal, said escape prefix code without inserting any meaningless data.

4. A versatile escape run-level coder as claimed in claim 1, wherein said detecting means further detects whether the detected level is below or above the first range, and produces a first outer range signal when said detected level is below said first range, and a second outer range signal when said detected level is above said first range.

5. A versatile escape run-level coder as claimed in claim 4, wherein said second sending means comprises:
    first outer range sending means for sending, in response to said first outer range signal, said run-level data with an insertion of first predetermined meaningful data; and
    second outer range sending means for sending, in response to said second outer range signal, said run-level data with an insertion of second predetermined meaningful data.

6. A versatile escape run-level coder as claimed in claim 1, wherein said first and second sending means comprise first selecting means for selecting data to be sent.

7. A versatile escape run-level coder as claimed in claim 1, wherein said third and fourth sending means comprise second selecting means for selecting data to be sent.

* * * * *

UNITED STATES PATENT AND TRADEMARK OFFICE
CERTIFICATE OF CORRECTION

PATENT NO. : 5,381,144
DATED : January 10, 1995
INVENTOR(S) : William Wilson et al.

It is certified that error appears in the above-indentified patent and that said Letters Patent is hereby corrected as shown below:

On the title page, insert item [57], line 1 of the abstract, after "coder," insert --is provided--.
    item [57], line 4 of the abstract, change "A selection logic" to --Selection logic--.
    item [57], line 10 of the abstract, change "36-bit long" to --36 bits long--.
    item [57], line 16 of the abstract, change "36-bit long" to --36 bits long--.
    item [57], line 17 of the abstract, change "example" to --e.g.,--.
Column 1, line 3, change "bit streams" to --bitstreams--.

Signed and Sealed this

Fifth Day of September, 1995

Attest:

*Attesting Officer*

BRUCE LEHMAN

*Commissioner of Patents and Trademarks*